United States Patent
Chien et al.

(10) Patent No.: US 9,465,460 B2
(45) Date of Patent: Oct. 11, 2016

(54) METHOD FOR CONTROLLING DISPLAY OF ELECTRONIC DEVICE AND ELECTRONIC DEVICE USING THE SAME

(71) Applicant: HTC Corporation, Taoyuan County (TW)

(72) Inventors: Chih-Ling Chien, Taoyuan County (TW); Hung-Yi Huang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 193 days.

(21) Appl. No.: 13/897,461

(22) Filed: May 20, 2013

(65) Prior Publication Data

US 2013/0314349 A1    Nov. 28, 2013

Related U.S. Application Data

(60) Provisional application No. 61/651,010, filed on May 24, 2012.

(51) Int. Cl.
 *G06F 3/041* (2006.01)
 *H03G 7/00* (2006.01)
 *G06F 1/16* (2006.01)
 (Continued)

(52) U.S. Cl.
 CPC ............. *G06F 3/041* (2013.01); *G06F 1/1626* (2013.01); *G06F 1/32* (2013.01); *G06F 1/324* (2013.01); *G06F 3/04883* (2013.01); *H03G 7/00* (2013.01); *Y02B 60/1217* (2013.01)

(58) Field of Classification Search
 CPC ........ G06F 3/041; G06F 1/1626; G06F 1/32; G06F 3/04883; G06F 1/324; G06F 3/044; G06F 3/0412; G06F 1/3218; G02F 1/13338; Y02B 60/1217; H03G 7/00

USPC ...................... 345/156–174; 178/18.03–18.06
See application file for complete search history.

(56) References Cited

U.S. PATENT DOCUMENTS 8,046,721 B2    10/2011   Chaudhri et al.
2006/0262101 A1    11/2006   Layton et al.
(Continued)

FOREIGN PATENT DOCUMENTS

CN    101529878    9/2009
CN    101702106    5/2010
(Continued)

OTHER PUBLICATIONS

"Office Action of Taiwan Counterpart Application", issued on Feb. 26, 2015, p. 1-p. 8.
(Continued)

*Primary Examiner* — Alexander Eisen
*Assistant Examiner* — Abhishek Sarma
(74) *Attorney, Agent, or Firm* — Jianq Chyun IP Office (57) ABSTRACT

A method for controlling a display of an electronic device is proposed along with the electronic device using the same. The electronic device has the display and a touch sensor disposed on the display. The method includes the following steps. The touch sensor is driven when the display is not driven to display an image. A sensing signal is received from the touch sensor. First information is determined based on the sensing signal. The first information is compared with first predetermined information. The display is driven to display the image when the first information matches the predetermined information.

25 Claims, 9 Drawing Sheets

(51) Int. Cl.
 *G06F 1/32* (2006.01)
 *G06F 3/0488* (2013.01)

(56) References Cited

U.S. PATENT DOCUMENTS

| | | | |
|---|---|---|---|
| 2008/0062140 A1* | 3/2008 | Hotelling et al. | 345/173 |
| 2008/0162996 A1* | 7/2008 | Krah et al. | 714/27 |
| 2009/0284482 A1* | 11/2009 | Chin | 345/173 |
| 2011/0034208 A1 | 2/2011 | Gu et al. | |
| 2012/0075249 A1* | 3/2012 | Hoch | 345/174 |
| 2012/0172085 A1* | 7/2012 | Vuppu et al. | 455/556.1 |
| 2013/0187863 A1* | 7/2013 | Rydenhag et al. | 345/173 |
| 2013/0307814 A1* | 11/2013 | Chang | G06F 3/0418 345/174 |

FOREIGN PATENT DOCUMENTS

| | | |
|---|---|---|
| CN | 101727272 | 6/2010 |
| CN | 101763160 | 6/2010 |
| CN | 102375581 | 3/2012 |
| TW | 201209645 | 3/2012 |

OTHER PUBLICATIONS

"Office Action of China Counterpart Application", issued on Sep. 22, 2015, p. 1-p. 8.

"Office Action of China Counterpart Application", issued on May 6, 2016, p. 1-p. 8.

* cited by examiner

METHOD FOR CONTROLLING DISPLAY OF ELECTRONIC DEVICE AND ELECTRONIC DEVICE USING THE SAME

CROSS-REFERENCE TO RELATED APPLICATION

This application claims the priority benefits of U.S. provisional application Ser. No. 61/651,010, filed on May 24, 2012. The entirety of the above-mentioned patent applications is hereby incorporated by reference herein and made a part of this specification.

BACKGROUND OF THE INVENTION

1. Field of the Invention

The application relates to a method for controlling a display of an electronic device and the electronic device using the same method.

2. Description of Related Art

Mobile devices are common in the market today. These mobile devices are often powered by batteries. However, the battery only provides power for a specific duration due to its battery life. In other words, for the same weight and performance of the mobile devices, efforts have been concentrated on maximizing the life of the mobile device's battery.

One approach for extending the battery life is to reduce the power consumption of the mobile devices. Generally speaking, the mobile devices may enter a sleep mode or an inactive mode to reduce power consumption after a period of inactivity of the touch screen. In the sleep mode, a display device and a touch screen of the mobile device are usually deactivated in order to reduce the power consumption of the mobile device. When a user wants to wake up or activate the display device and the touch screen of the mobile device, a power button can be adopted to activate the display device and the touch screen.

Figure 1:
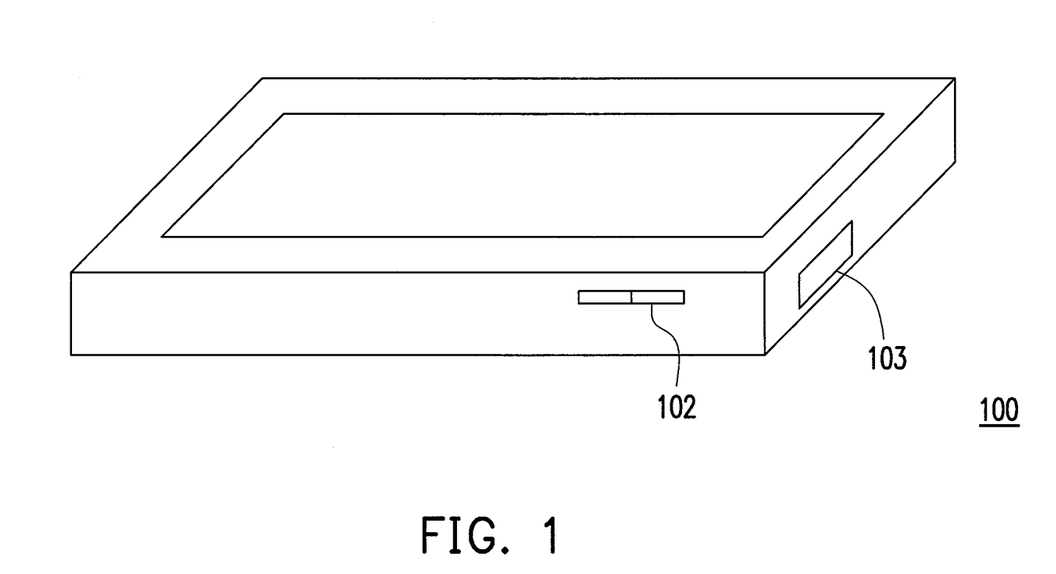
FIG. 1 is a schematic diagram illustrating a mobile device.

FIG. 1 is a schematic diagram illustrating a mobile device. Referring to FIG. 1, the mobile device 100 includes a volume switch actuator 102 and a power button 103. The volume switch actuator 102 is placed at one side of its housing, and configured for the user to manually adjust the volume (i.e., a signal amplitude of audio output signals). The power button 103 may be operated by the user to wake up or activate the display device and touch screen of the mobile device 100. The power button 103 is manufactured separately from the mobile device 100's casing, and placement hole(s) are needed to accommodate for the power button 103. The power button 103 is a separate and distinct part, and when it is combined with the housing, it will result in a protrusion on the surface of the housing. When the mobile device 100 is in a sleep mode or inactive mode, the user may accidentally press upon the power button 103 and leads to an undesired activation to the display device and touch screen. Alternatively, if the user wants to change the wake-up mode to a sleep mode of the mobile device 100, the user may need to press upon the power button 103. The aforementioned operation method for changing the operation mode of the mobile device 100 is counterintuitive. That is, when the user wants to change the operation mode of the mobile device 100, the user needs to locate the button position based on the protrusion on the housing surface. On the other hand, the user might mistakenly press the power button 103, and this situation may result in an undesired activation or deactivation to the mobile device 100. Accordingly, it would be desirable to have a mobile device, which includes a more convenient control method that changes the operation modes more efficiently.

SUMMARY OF THE INVENTION

The present application provides a method for controlling a display of an electronic device, such that the user may easily control the display by inputting information to the touch sensor.

A method for controlling a display of an electronic device is introduced herein. The electronic device has the display and a touch sensor disposed on the display. The method includes the following steps. The touch sensor is driven when the display is not driven to display an image. A sensing signal is received from the touch sensor. First information is determined based on the sensing signal. The first information is compared with first predetermined information. The display is driven to display the image when the first information matches the predetermined information.

An electronic device is introduced herein. The electronic device includes a display, a touch sensor, a driving circuitry, a sensing circuitry and a processing unit. The display is configured to display an image. The touch sensor is disposed on the display and configured to detect a contact on the touch sensor and generated a sensing signal when the display is not driven to display the image. The driving circuitry is coupled to the display and the touch sensor and configured to drive the display and the touch sensor. The sensing circuitry is coupled to the touch sensor to receive the sensing signal and determining first information based on the received sensing signal. The processing unit is coupled to the driving circuitry and the sensing circuitry and comparing the first information with first predetermined information. When the first information matches the first predetermined information, the driving circuitry drives the display to display the image.

The application provides a computer-readable medium, which records a computer program to be loaded into a mobile device to execute the aforementioned method for controlling the display of the electronic device. The computer program is composed of a plurality of program instructions (for example, an organization chart establishing program instruction, a table approving program instruction, a setting program instruction, and a deployment program instruction, etc), and these program instructions are loaded into the electronic device and executed by the same to accomplish various steps of the method for controlling the display of the electronic device.

In order to make the aforementioned and other features and advantages of the application comprehensible, several exemplary examples accompanied with figures are described in detail below.

BRIEF DESCRIPTION OF THE DRAWINGS

The accompanying drawings are included to provide a further understanding of the application, and are incorporated in and constitute a part of this specification. The drawings illustrate examples of the application and, together with the description, serve to explain the principles of the application.

DETAILED DESCRIPTION OF DISCLOSED EMBODIMENTS

Some examples of the present application will now be described more fully hereinafter with reference to the accompanying drawings, in which some, but not all examples of the application are shown. Indeed, various examples of the application may be embodied in many different forms and should not be construed as limited to the examples set forth herein; rather, these examples are provided so that this application will satisfy applicable legal requirements. Like reference numerals refer to like elements throughout.

Figure 2:
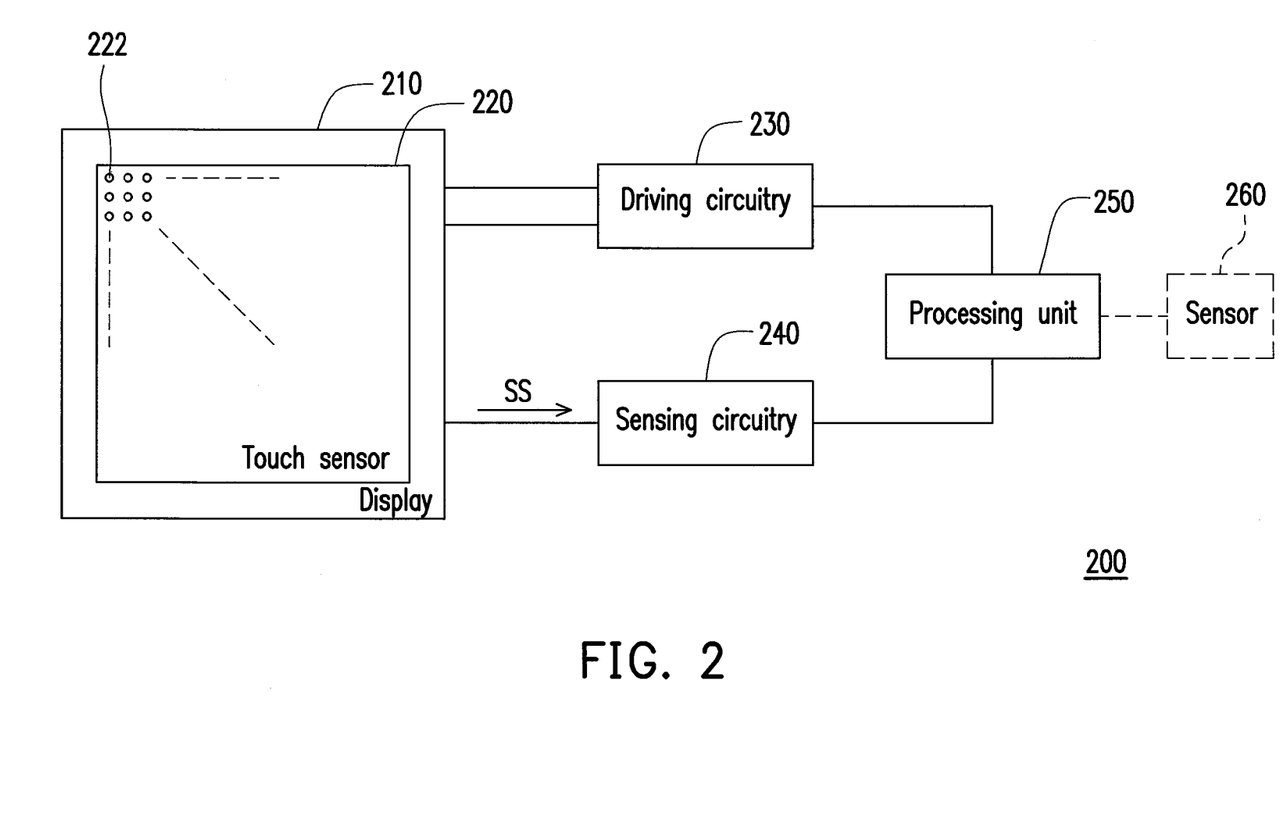
FIG. 2 is a functional block diagram illustrating an electronic device according to an exemplary example of the present application.

FIG. 2 is a functional block diagram illustrating an electronic device according to an exemplary example of the present application. In the present example, the electronic device 200 includes a display 210, a touch sensor 220, a driving circuitry 230, a sensing circuitry 240 and a processing unit 250. The electronic device 200 may be a smartphone, a tablet, a personal digital assistant (PDA) or the like. The display 210 may include at least one of a liquid crystal display (LCD), a thin film transistor (TFT)-LCD, an organic light-emitting diode (OLED), a flexible display, a three-dimensional (3D) display and so forth. The touch sensor 220 may be disposed on the display 210 and include sensing elements 222 arranged in rows and columns and configured for receiving touch events or hover events.

The touch event includes a touching of finger, palm, body parts or other objects against a touch-sensitive surface of the touch sensor 220. The hover event includes a hovering of finger, palm, body parts or other object near the touch sensor 220. The sensing elements 222 of the touch sensor 220 can be, for example, capacitive touch sensing elements, resistive touch sensing elements, surface acoustic wave touch sensing elements, electromagnetic touch sensing elements, near field imaging touch sensing elements, and the like.

In other examples, the touch sensor 220 may include a capacitive sensing medium having a plurality of row traces (may be referred to be scanning lines) or driving lines and a plurality of column traces or sensing lines, although other sensing media may also be used. The row traces and the column traces may be formed from a transparent conductive medium, such as Indium Tin Oxide (ITO) or Antimony Tin Oxide (ATO), although other transparent and non-transparent materials, such as copper, can also be used. In yet other examples, the row traces and the column traces can be formed on opposite sides of a dielectric material, and can be perpendicular to each other. It is noted that in other examples, the row traces and column traces can be formed on a single side of a substrate, or can be formed on two separate substrates separated by a dielectric material. In some other examples, the dielectric material can be transparent, such as glass, or can be formed from other materials, such as mylar. An additional dielectric cover layer or a reinforced glass layer may be placed over the row traces or the column traces to strengthen the structure and protect the entire assembly from damage.

In some examples, the touch sensor 220 may enable the electronic device 200 to sense both the touch events (for example, the touching of fingers, palm, body parts or other objects upon a touch-sensitive surface of the touch sensor 220 at distinct locations at about the same time) and the hover events (for example, the no-touch, close proximity hovering of fingers, palm, body parts or other objects above the touch-sensitive surface but outside the near-field detection capabilities of some touch sensors of the touch sensor 220).

The driving circuitry 230 is coupled to the display 210 and the touch sensor 220. The driving circuitry 230 is configured to drive the display 210 and the touch sensor 220. The sensing circuitry 240 may be coupled to the display 210 and the touch sensor 220. The touch sensor 220 according to one example of this application can detect multiple touches (touch events or contacts) that occur at about the same time (and at different times), and then the sensing circuitry 240 can identify and track locations of the detected touch events or the contact points. The contacts may be provided by any combination of one or more finger, a face, a palm, a pen or a hover-based input to the touch sensor 220, but the application is not limited thereto.

The sensing circuitry 240 may receive the sensing signal SS and determine first information based on the received sensing signal SS. The first information may be an image, a pattern or a gesture corresponding to the sensing signal SS. The gesture may be defined as any kind of sliding operations occurring on the touch sensor 220 performed by the user, but the application is not limited thereto.

A gesture is a motion of the object/appendage making contact with the touch sensor. The object may be user's figure, palm, ear or any part of user's body. For example, the predefined gesture may include a contact of the touch sensor on the left edge (to initialize the gesture), a horizontal movement of the point of contact to the opposite edge while maintaining continuous contact with the touch sensor, and a breaking of the contact at the opposite edge (to complete the gesture). A sequence of data such as sensing signal relating to the motion of a gesturing is generated. A selected set of data items from the sequence are tested against pre-learned threshold values, to determine a probability of the sequence representing a certain gesture. If the probability is greater than a predetermined value, then the gesture is detected. Such a gesture may be recognized by using a touch sensor divided into a small number of large regions. The gesture is then identified by tracking a presence of the finger in each of the regions over time. The contact may include one or more taps on the touch screen, maintaining continuous contact with the touch sensor, movement of the point of contact while maintaining continuous contact, a breaking of the contact, or any combination thereof.

In some examples, at the "intersections" of the row traces and the column traces in the touch sensor 220, where the traces pass above and below (cross) each other (but do not make direct electrical contact with each other), the traces essentially form two electrodes (although more than two traces could intersect as well). Each intersection of row traces and column traces can represent, for example, a capacitive sensing node and can be viewed as picture element, which can be particularly useful when the touch sensor 220 is viewed as capturing an "image" of touch and hover.

In other words, after the sensing circuitry 240 has determined whether a touch event or a hover event has been detected at some of the sensing elements 222 in the touch sensor 220, the pattern of sensing elements 222 in the touch sensor 220 at which a touch event or a hover event occurred can be viewed as an "image" of touch (e.g., a pattern of fingers touching or hovering the touch sensor 220).

In another example, the electronic device 200 may further comprise a sensor 260, which may be a proximity sensor. The sensor 260 can be configured to trigger the functionality of deactivating the display 210 without actually making contact with the touch sensor 220. In one specific example, if a cheek of the user is detected near the touch sensor 220 by one or more sensing elements 222 in the touch sensor 220, the display 210 can be deactivated, dimmed or powered down to save power of the electronic device 200.

In some examples, the stimulus inputs which are sequentially applied to each one of the rows in the touch sensor 220 by the driving circuitry 230 can be implemented, but not limited, as a pulse train with a driving frequency or a specific scanning frequency. The stimulus inputs with the driving frequency or the scanning frequency are configured for periodically charging the sensing elements 222 in the touch sensor 220. If a sensing element is charged by the stimulus inputs, the sensing element will be activated to be able to sense the touch events or the hover events. On the other hand, if a sensing element is not charged by the stimulus inputs, the sensing element's abilities of sensing the touch events or the hover events are disabled, i.e., the sensing element is deactivated.

The processing unit 250 may be coupled to the driving circuitry 230 and the sensing circuitry 240. The processing unit 250 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, an ARM-based processor, and the like.

The processing unit 250 may receive the input signals from the sensing circuitry 240 and may be configured for performing actions based on the outputs that may include, but are not limited to, unlocking the electronic device 200, enabling the driving circuitry 230 to drive the display 210, enabling the backlight module of the display 210 to generate a backlight for the display 210, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, operation on voice-over-Internet packet voice call (VoIP call), changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like.

In some examples, the electronic device 200 may further include a sensor 260, coupled to the processing unit 250. The sensor 260 may sense a property of an object or an environment external to the electronic device 200 and generating a sensing information based on the sensed property. The processing unit 250 may determine whether to drive the touch sensor 220 based on the sensing information when the display 210 is not driven to display the image. The sensing information may be an electrical signal as a function of the property of an object sensed by the sensor 260 or the environment external to the electronic device 200 imposed on the sensor. In some examples, the sensor 260 may include one or more proximity sensors. The proximity sensor according to some examples may include resistive touch sensors, surface acoustic wave touch sensors, electromagnetic sensor, near field imaging touch sensors, light sensor and the like. The sensor 260 may be a gravity sensor, gyro sensor, accelerometer, light sensor, or image sensor.

The sensor 260 may be able to detect the presence of nearby objects without any physical contact. For example, a proximity sensor may emit an electromagnetic field or a beam of electromagnetic radiation (infrared, for instance), and looks for changes in the field or return signal. The object being sensed by the proximity sensor may be referred to as the proximity sensor's target. Different proximity sensor targets demand different sensors. For example, a capacitive or photoelectric sensor might be suitable for a plastic target; an inductive proximity sensor always requires a metal target. The maximum distance that this sensor can detect is defined "nominal range". Some sensors have adjustments of the nominal range or means to report a graduated detection distance. Proximity sensors may have a high reliability and long functional life because of the absence of mechanical parts and lack of physical contact between sensor and the sensed object. Fro example, International Electrotechnical Commission (IEC) 60947-5-2 defines the technical details of proximity sensors. A proximity sensor adjusted to a very short range may be used as a touch switch. For example, a proximity sensor may be divided in two halves, and when the two halves move away from each other, then a signal may be activated a controller connected to the proximity sensor.

The sensor 260 is coupled to the processing unit, sensing a property of an object or an environment external to the electronic device and generating a sensing information based on the sensed property and wherein the processing unit determines whether to drive the touch sensor based on the sensing information when the display is not driven to display the image. The sensing information is an electrical signal as a function of the property of an object sensed by the sensor or the environment external to the electronic device imposed on the sensor. For example, the sensor may be a proximity sensor. When the sensor detects that no object is in proximity of the electronic device, the touch sensor 220 is not driven by the driving circuitry to sense the touch on the touch sensor. When the sensor detects that an object is in proximity of the electronic device, the touch sensor 220 is driven by the driving circuitry to sense the touch on the touch sensor.

Figure 3A:
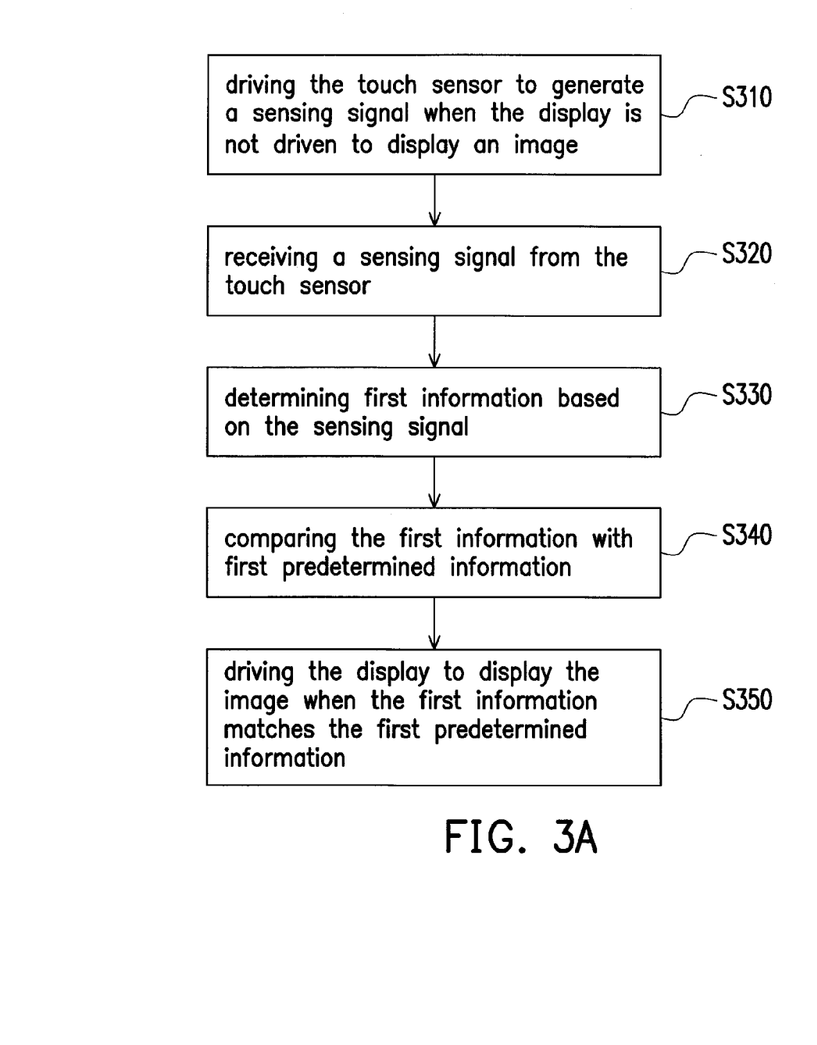
FIG. 3A is a flow chart illustrating a method for controlling a display of an electronic device according an exemplary example of the present application.

FIG. 3A is a flow chart illustrating a method for controlling a display of an electronic device according an exemplary example of the present application. Referring to both FIG. 2 and FIG. 3A, the proposed method for controlling the display of the electronic device may be adapted for the electronic device 200, but the application is not limited thereto.

In step S310, the driving circuitry 230 may drive the touch sensor 220 to generate the sensing signal SS when the display 210 is not driven to display an image. The driving circuitry 230 may stop driving the display 210 to disable the display 210 from displaying image or disable the backlight of the display 210. When the display 210 is not displaying the image, the electronic device 200 may be referred as being in a sleep mode (or a locked mode). In general, when the electronic device 200 is in the sleep mode (or the locked mode), both of the display 210 and the touch sensor 200 would be disabled. However, in the present application, only the display 210 would be disabled when the electronic device 200 is in the sleep mode (or the locked mode). That is, the touch sensor 220 would be still operating to sense the aforementioned touch events or hover events.

In some examples, the driving circuitry 230 may change the driving frequency or the scanning frequency of the touch sensor. In detail, when the electronic device 200 is in the sleep mode, the sensing circuitry 240 still maintains the detection functionality. In detail, since the user of the electronic device 200 may not perform other inputs when the display 210 is not displaying the image, the driving circuitry 230 may reduce the driving frequency of the scanning frequency of the first stimulus inputs to reduce the power consumption of the electronic device 200.

In some examples, the driving circuitry 220 may drive a portion of the touch sensor 220 to generate the sensing signal SS when the display 210 is not displaying the image. That is, the driving circuitry 230 may drive (or activate) a part of the sensing elements 222 of the touch sensor 220, instead of driving all of the sensing elements 222. From another point of view, the driving circuitry 230 may partially charge the sensing elements 222 on the touch sensor 220 to generate the sensing signal. In detail, since the user of the electronic device 200 may not input instructions while the display 210 is being disabled, the power consumption of detection may be saved by not driving or charging all of the sensing elements 222 of the touch sensor 220. Detailed description about the mechanism of partially charging would be discussed later.

In step S320, the sensing circuitry 240 may receive the sensing signal SS from the touch sensor 220. The sensing signal SS may be generated by the touch sensor 220 when an object touches on the touch sensor 220 (i.e., a touch event occurs) or hovers above the touch sensor 220 (i.e., a hover event occurs). The details of the touch event and the hover event could be referred to the aforementioned discussion, which would not be repeated herein.

In step S330, the sensing circuitry 240 may determine first information based on the sensing signal SS. The first information (e.g., a gesture or a pattern) may be determined by calculating the sensing signal SS when an object touches on the touch sensor 220 (i.e., a touch event occurs) or hovers above the touch sensor 220 (i.e., a hover event occurs). Besides, the sensing circuitry 240 may determine the first information by calculating the sensing signal SS over a period of time. That is, the sensing circuitry 240 would determine the first information based on the continually inputted sensing signal SS, instead of determine the first information instantly when the sensing signal SS is initially generated. From another point of view, the sensing circuitry 240 may determine the first information according to the "image" corresponding the sensing signals SS as mentioned in the previous discussion, whose details would not be repeated herein.

In step S340, the processing unit 250 may compare the first information with first predetermined information. The first predetermined may be specific information (e.g., a gesture or a pattern) configured for the user to control the display of the electronic device 200. Alternatively, the first predetermined information may be viewed as a specific information, image, gesture or pattern configured for the user to wake up (or unlock) the electronic device 200 from the sleep mode (or locked mode). The first predetermined information may be a circle, a triangle, a rectangle or any kinds of polygon patterns, which is not limited thereto. The predetermined information may be a gesture stored in the memory of the electronic device 200. The gesture may be setup by the user of the electronic device 200. The user may input the gesture to the electronic device 200 and store the inputted gesture as predetermined information or predetermined gesture.

In step S350, the driving circuitry 230 may drive the display 210 to display the image (e.g., the home screen of the electronic device 200) when the first information matches the first predetermined information. In detail, when the first information matches the first predetermined information, the processing unit 250 may determine that the user of the electronic device 200 wants to wake up (or unlock) the electronic device 200 from the sleep mode (or the locked mode). Therefore, the processing unit 250 may control the driving circuitry 230 to drive (or activate) the display 210 to display the home screen of the electronic device 200. The driving circuitry 230 may drive the display 210 to enable the display 210 to display image or enable the backlight of the display 210.

As a result, the examples of the present application provide a novel method for controlling the display of the electronic device. By maintaining the detecting function of the touch sensor while the display is being deactivated, the touch sensor may constantly detect the inputted information of the user. In the duration that the display is being deactivated, when the processing unit determines the inputted information of the user matches the first predetermined information, the driving circuitry may accordingly drive or activate the display. In other words, the user may wake up (or unlock) the electronic device or activate the display by inputting information to the touch sensor, instead of triggering the power button of the electronic device in a conventional way. Therefore, the examples of the present application provide a novel way for the user to control the display of the electronic device.

Figure 3B:
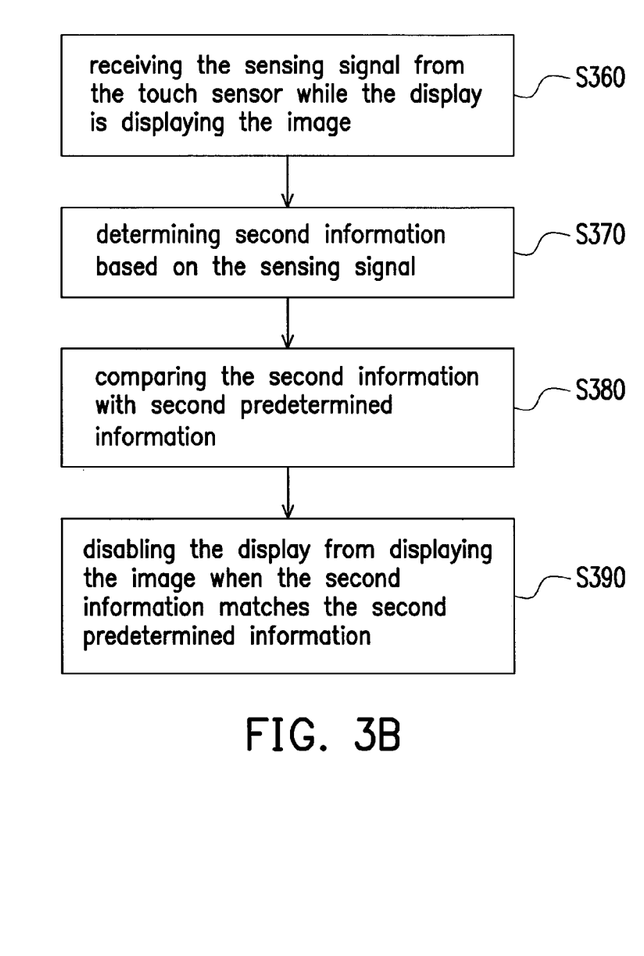
FIG. 3B is a flow chart illustrating a method for controlling a display of an electronic device according another exemplary example of the present application.

FIG. 3B is a flow chart illustrating a method for controlling a display of an electronic device according another exemplary example of the present application. Referring to both FIG. 2 and FIG. 3B, the proposed method for controlling the display of the electronic device may be adapted for the electronic device 200, but the application is not limited thereto. In the present example, the electronic device 200 may allow the user to control the display 210 (e.g., lock the electronic device 200 or switch the electronic device 200 to the sleep mode) by inputting information (e.g., a gesture) while the display 210 is displaying. Detailed discussion would be provided in the following description. Herein, the driving circuitry 230 may fully charge the sensing elements 222 on the touch sensor 220 to generate the sensing signal SS. Further, the driving circuitry 230 may change the driving frequency of the touch sensor 210 as mentioned in previous discussion.

In step S360, the sensing circuitry 240 may receive the sensing signal SS from the touch sensor 220 while the display 210 is displaying the image. In step S370, the sensing circuitry 240 may determine second information based on the sensing signal SS. In step S380, the processing unit 250 may compare the second information with second predetermined information. The second predetermined information may be specific information, image, gesture or pattern configured for the user to control the display 210 of the electronic device 200. On the other hand, the second predetermined information may be alternatively viewed as specific information, image, gesture or pattern configured for the user to lock the electronic device 200, switch the electronic device 200 to the sleep mode or turn of the display 210, which is not limited thereto. The second predetermined information may be the same as the first predetermined information, but the application is not limited thereto. In step S390, the driving circuitry 230 may disable the display 210 from displaying the image when the second information matches the second predetermined information. In detail, when the second information matches the second predetermined information, the processing unit 250 may determine that the user of the electronic device 200 wants to lock the electronic device 200, switch the electronic device 200 to the sleep mode or turn off the display 210. Therefore, the processing unit 250 may control the driving circuitry 230 to stop driving (i.e., deactivate) the display 210, such that the display 210 would correspondingly stop displaying. In some examples, the driving circuitry 230 may disable the display 210 by disabling a backlight module of the display 210, but the application is not limited thereto.

As a result, the example of the present application provides a novel method for controlling the display of the electronic device. By comparing the inputted information with the second predetermined information while the display is displaying, the processing unit may determine whether to control the driving circuitry to stop driving the display. Therefore, when the user wants to lock the electronic device, switch the electronic device to the sleep mode or turn off the display, the user may simply input information (e.g., a gesture) similar to the second predetermined information. Afterwards, the display of the electronic device would be accordingly controlled in response to a series of operations of the touch sensor, the sensing circuitry, the processing unit and the driving circuitry as mentioned before. In other words, the example of the present application further provides a novel way for the user to control the display of the electronic device.

In some examples, the term "partially charging" in the present application means that only some of the sensing elements 222 in the touch sensor 220 are activated by stimulus inputs, while the others of sensing elements 222 are deactivated sensing elements 222. The arrangement (i.e., the amount and positions) of the activated sensing elements 222 in the touch sensor 220 can be adjusted to be any kinds of combinations. For example, the positions of activated sensing elements 222 can be arranged, but not limited to, as selective rows in the touch sensor 220, as selective columns in the touch sensor 220, with random positions in the touch sensor 220, in the upper half of the touch sensor 220, in the lower half of the touch sensor 220, in the left half of the touch sensor 220, in the right half of the touch sensor 220, near the central region of the touch sensor 220, around the edges of the touch sensor 220, in the regions that the user frequently used in the touch sensor 220, and so forth.

FIG. 4A-4D are schematic diagrams respectively illustrating four kinds of partially charging mechanisms according to exemplary examples of the present application. Each of the intersections of the rows and columns in FIG. 4A-4D represents one of the sensing elements 222 in the touch sensor 220. Each of intersections in FIG. 4A-4D labelled by large black dots in the touch sensor 220 are the sensing elements 222 currently activated by stimulus inputs, while the other intersections without labelling as the large black dots are the sensing elements 222 without stimulus inputs (i.e., these sensors are currently deactivated).

Figure 4A:
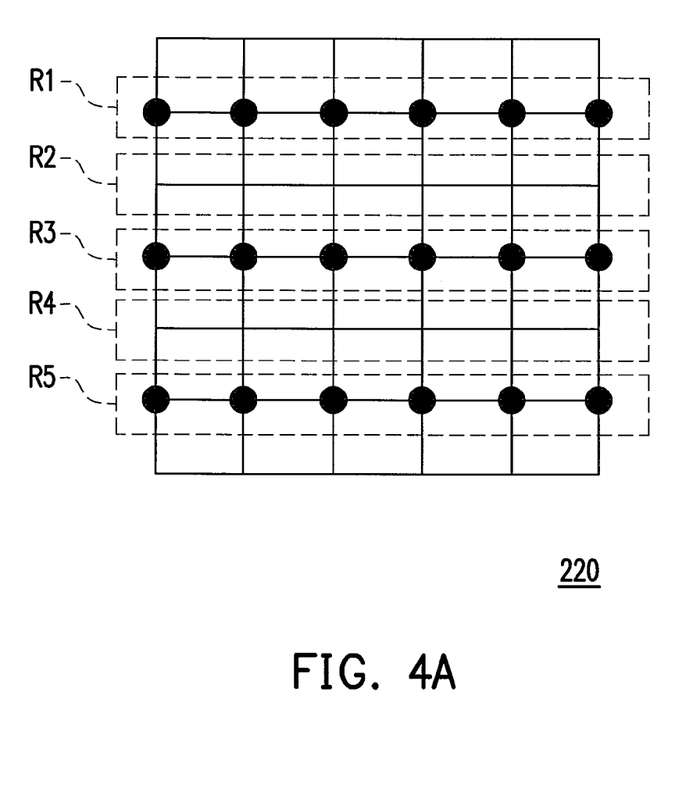
FIG. 4A-4D are schematic diagrams respectively illustrating four kinds of partially charging mechanisms according to exemplary examples of the present application.

Referring to FIG. 4A, the arrangement of activated sensing elements 222 in the touch sensor 220 is an example of arranging the activated sensing elements 222 as selective rows in the touch sensor 220. The touch sensor 220 is partially charged with rows R1, R3 and R5, that is, the stimulus inputs are only applied to the sensing elements in rows R1, R3 and R5 but not to the sensors in rows R2 and R4. Since the user of the touch sensor 220 may still perform some inputs of other touch events or hover events to the touch sensor 220 when the display 210 is not driven (e.g., the electronic device 200 is in the sleep mode), the partially charging mechanism may enable the touch sensor 220 to maintain the detection functionality with lower power consumption.

Figure 4B:
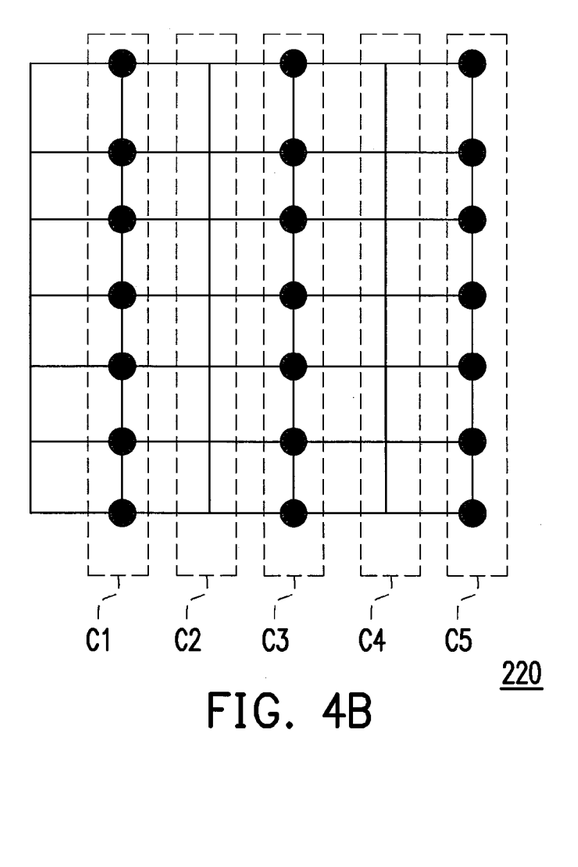

Referring to FIG. 4B, the arrangement of activated sensing elements 222 in the touch sensor 220 is an example of arranging the activated sensing elements 222 as selective columns in the touch sensor 220. The touch sensor 220 is partially charged with columns C1, C3 and C5, that is, the stimulus inputs are only applied to the sensing elements in columns C1, C3 and C5 but not to the sensing elements in columns C2 and C4.

Figure 4C:
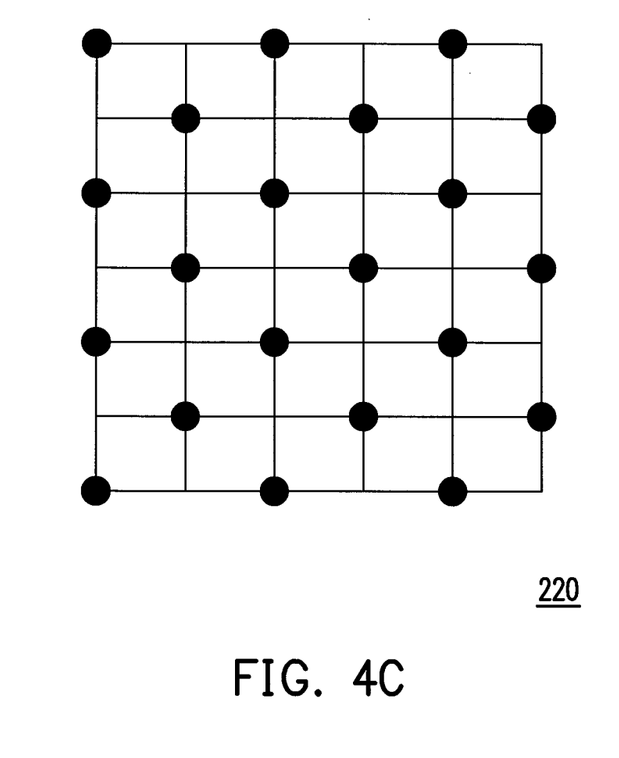

Referring to FIG. 4C, FIG. 4C illustrates another kind of arrangement of activated sensing elements 222 in the touch sensor 220. In a particular row of the touch sensor 220 in FIG. 4C, every two activated sensing elements are spaced by one deactivated sensing element. In a particular column of the touch sensor 220 in FIG. 4C, every two activated sensing elements are also spaced by one deactivated sensing element.

Figure 4D:
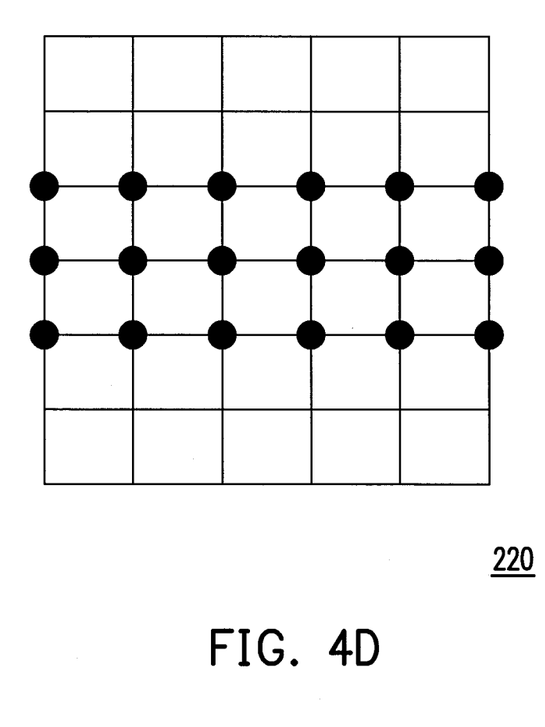

Referring to FIG. 4D, the arrangement of activated sensing elements 222 in the touch sensor 220 is an example of arranging the activated sensing elements near the central region of the touch sensor 220. The arrangement of activated sensing elements in FIG. 4D also can be regarded as another kind of arranging the activated sensing elements as selective rows in the touch sensor 220. In some examples, the user of the electronic device 200 may be accustomed to use a specific region of the touch sensor 220, that is, some regions in the touch sensor 220 may be frequently used by the user. Generally speaking, those frequently used regions may locate more likely, but not limited to, near the central region of the touch sensor 220, instead of locating around the edges of the touch sensor 220. In this scenario, the arrangement as illustrated in FIG. 4D may enable more accurate sensing abilities than the arrangement as illustrated in FIG. 4A, although the amounts of activated sensors in the two figures may be the same.

It is noted that the main idea of the aforementioned information matching determination should be whether the "image" of the touch events or the hover events (i.e., the first information or the second information) matches the predetermined information (i.e., the first predetermined information and the second predetermined information). In some examples, the predetermined information may include, but not limited to, triangles, circles, hexagons, squares, rectangles, parallelogram, diamond, star or any other geometrical shapes which can be input by finger, palm, body parts or other objects. The predetermined information may also include, but not limited to, words, lines, alphabets, scribbling, drawings, dots or any other information, which can be input by finger, palm, body parts or other objects.

In some examples, the characteristics (e.g., scale, orientation, order of drawing, position of drawing, etc.) of the inputted information of the touch events or the hover events may not be completely matched to the predetermined information. Nevertheless, as long as the inputted information of the touch events or the hover events can "roughly" or "approximately" match the predetermined information, the inputted information of the touch events or the hover events will be determined to be valid. That is, the inputted information will be determined by the processing unit 250 to be matched to the predetermined information, even the scale, the orientation, the order of drawing or position of drawing of the inputted information may be slightly different from the predetermined information.

Figure 5A:
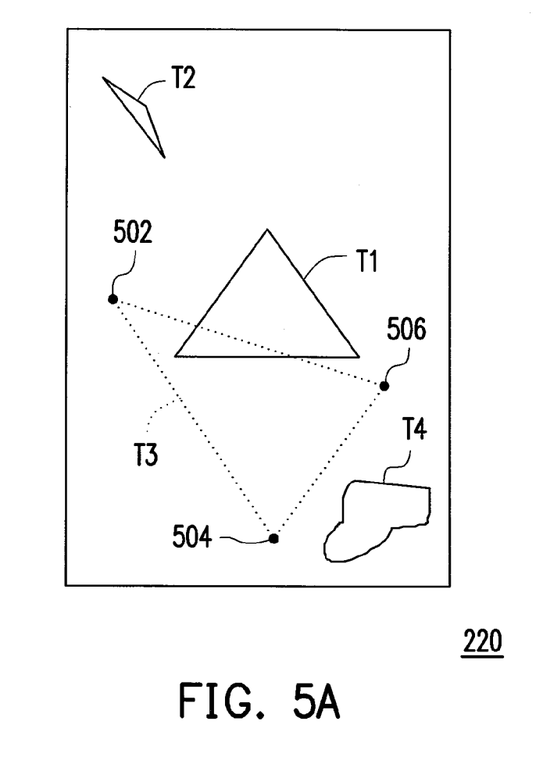
FIG. 5A-5C are schematic diagrams respectively illustrating three kinds of pattern matching determination according to exemplary examples of the present application.
Figure 5B:
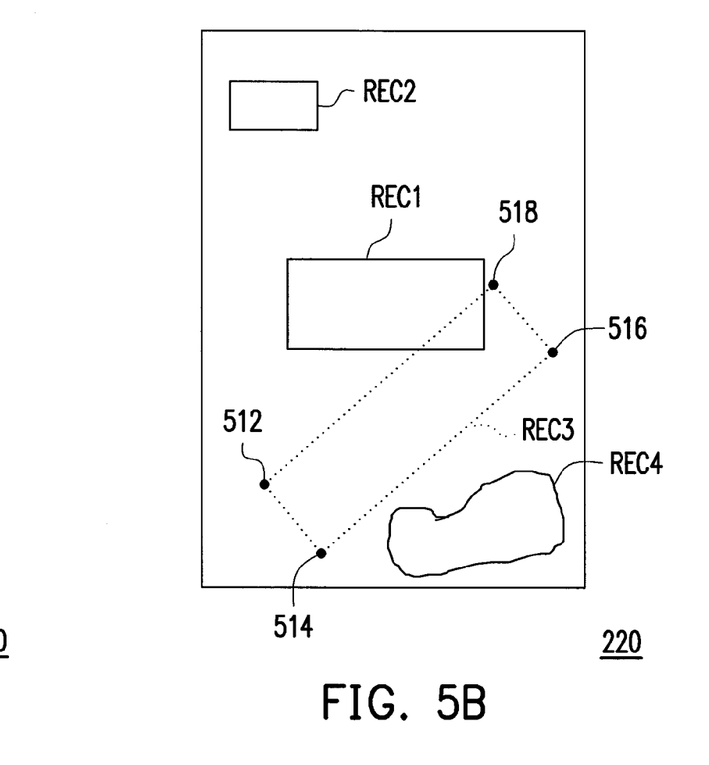
Figure 5C:
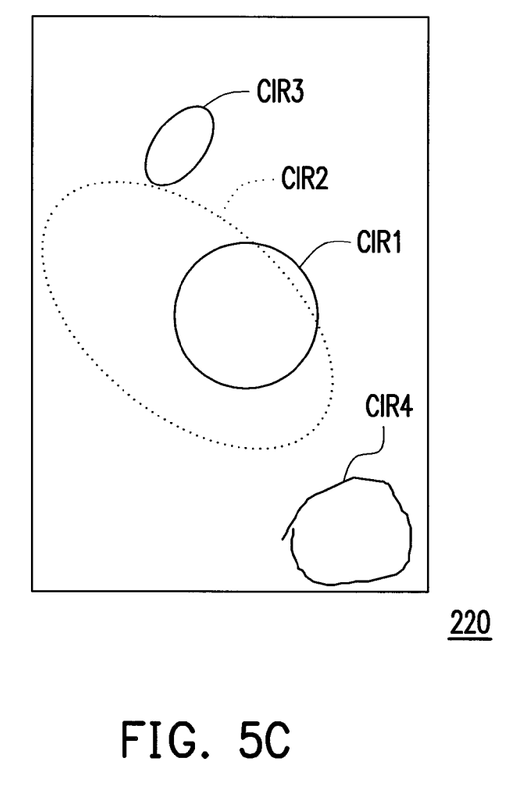

FIG. 5A-5C are schematic diagrams respectively illustrating three kinds of information matching determination according to exemplary examples of the present application. Referring to FIG. 5A, a triangle T1 is assumed to be the predetermined information (i.e., the first predetermined information or the second predetermined information). In this case, when a user can precisely input information of touch events or hover events by finger, palm, body parts or other objects and the inputted information is completely the same as the triangle T1 (i.e., the scale, the orientation, or the position of drawing are the same as the triangle T1), the processing unit 250 can surely determine the inputted information is matched to the triangle T1.

However, it is quite difficult for the user to perform such a precise input of information. In some examples, the inputted information may not be exactly the same as the triangle T1. For example, if the user inputs information (e.g., a gesture, a pattern or an image) similar to a triangle T2, which can be a shrunk, distorted, compressed and rotated version of the triangle T1 and in a different location to the triangle T1, the processing unit 250 may still determine that the triangle T2 is matched to the triangle T1 because the triangles T1 and T2 are "roughly similar" to each other. This concept may also be adopted to triangles T3 and T4. Although the triangle T3 appears to be an enlarged, distorted and rotated version of the triangle T1, the processing unit 250 can still determine that the triangle T3 is matched to triangle T1. The triangle T4 can be also a shrunk, distorted, compressed and rotated version of the triangle T1. The sides and the corners of the triangle T4 are even not straight or sharp. However, the processing unit 250 can still determine that the triangle T4 matches the triangle T1 because of their similar appearances.

Further, the order of drawing the image of touch events or hover events is also not strict in the present application. For example, the user may draw the triangle T3 in a counter-clockwise way (e.g., starting from the node 502 to the nodes 504, 506 and finally back to the node 502), in a clockwise way (e.g., starting from the node 504 to the nodes 502, 506 and finally back to the node 504) or in other ways that can finish the triangle T3. All of the ways of drawing the triangle T3 are valid because the resulting "image" of the mentioned drawing ways are the same, which lead to the same consequences, i.e., the triangle T3 is determined to be matched to the triangle T1.

Referring to FIG. 5B, a rectangle REC1 is assumed to be the predetermined information (i.e., the first predetermined information or the second predetermined information). Similarly, if a user can precisely input an image of touch events or hover events by finger, palm, body parts or other objects and the image is completely the same as the rectangle REC1, the processing unit 250 can also surely determine the inputted information is matched to the rectangle REC1. However, if the inputted information of the user appears to be like rectangles REC2-REC4, these inputted information may still be determined to be matched to the rectangle REC1 for their approximately similar appearances to the rectangle REC1. Since the order of drawing the image is not strict in the present application, the rectangle REC3 can be drawn in a counter-clockwise way (e.g., starting from the node 512 to the nodes 514, 516, 518 and finally back to the node 512), in a clockwise way (e.g., starting from the node 516 to the nodes 514, 512, 518 and finally back to the node 516) or in other ways that can finish the rectangle REC3. All of the ways of drawing the rectangle REC3 are valid because the resulting "image" of the aforementioned drawing ways are the same, which lead to the same consequences, i.e., the rectangle REC3 is determined to be matched to the rectangle REC1. Likewise, the processing unit 250 may still determine that the rectangle REC4 is matched to the rectangle REC1 because of their similar appearances.

Referring to FIG. 5C, a circle CIR1 is assumed to be the predetermined information (i.e., the first predetermined information or the second predetermined information). Similarly, when a user can precisely input information of touch events or hover events by finger, palm, body parts or other objects and the image is completely the same as circle CIR1, the processing unit 250 can also surely determine the inputted information is matched to the circle CIR1. However, when the inputted information of the user appears to be like the circles CIR2-CIR4, these inputted information may still be determined to be matched to the circle CIR1 for their approximately similar appearances to the circle CIR1.

Figure 6A:
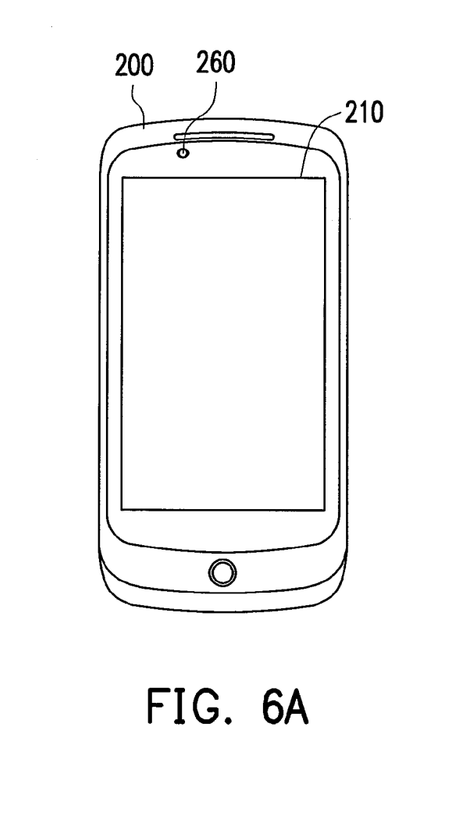
FIG. 6A-6C are schematic diagrams sequentially illustrating a mechanism of controlling the display of an electronic device according to an exemplary example of the present application.
Figure 6B:
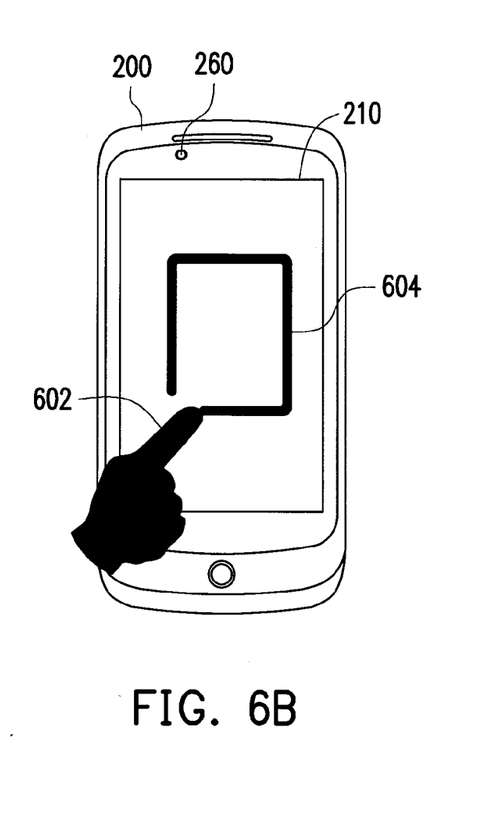
Figure 6C:
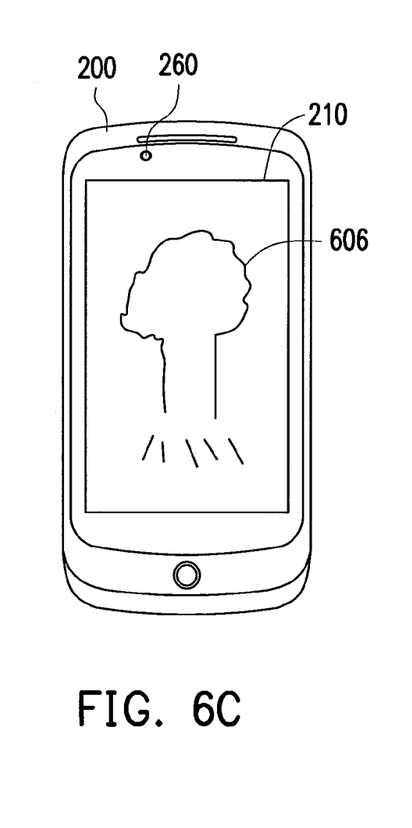

FIG. 6A-6C are schematic diagrams sequentially illustrating a mechanism of controlling the display of an electronic device according to an exemplary example of the present application. In this example, the first predetermined information can be assumed to be a rectangle-shaped pattern. Referring to FIG. 6A, since the display 210 is not driven, there is no objects displayed by the deactivated display 210. Referring to FIG. 6B, when the user of the electronic device 200 uses a finger 602 to input a pattern 604, which is similar to the first predetermined information, the processing unit 250 can determine that the pattern 604 is matched to the first predetermined information. Referring to FIG. 6C, after the operation illustrated in FIG. 6B, the processing unit 250 controls the driving circuitry 230 to drive (or activate) the display 210. Therefore, the display 210 may correspondingly display the image 606.

Figure 7A:
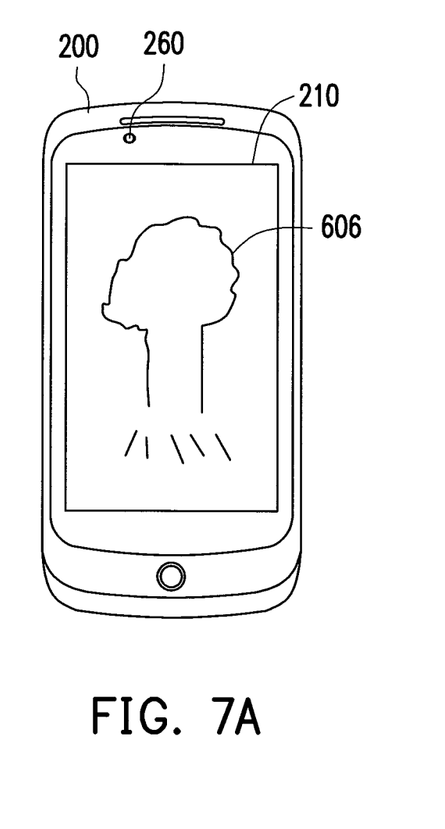
FIG. 7A-7C are schematic diagrams sequentially illustrating a mechanism of controlling the display of an electronic device according to another exemplary example of the present application.
Figure 7B:
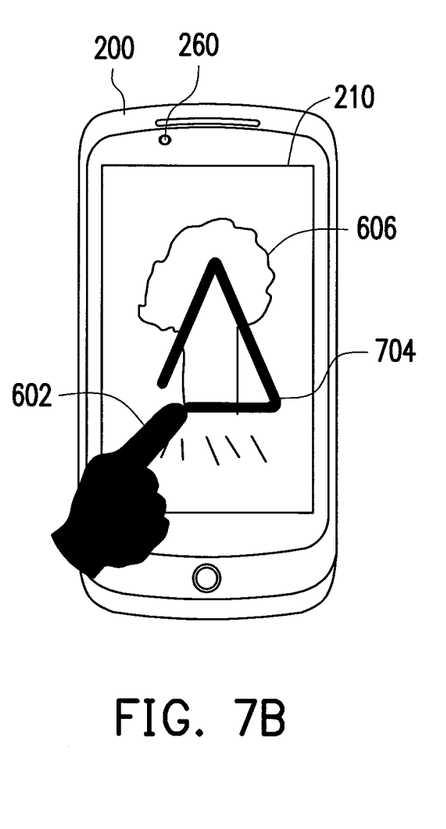
Figure 7C:
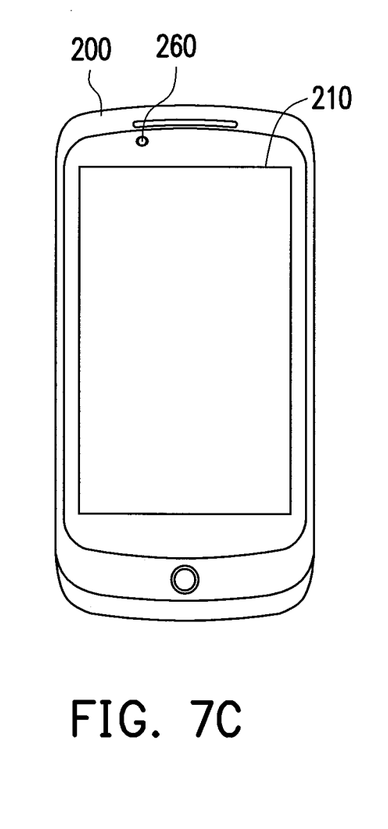

FIG. 7A-7C are schematic diagrams sequentially illustrating a mechanism of controlling the display of an electronic device according to another exemplary example of the present application. In this example, the second predetermined information can be assumed to be a triangle-shaped pattern. Referring to FIG. 7A, the display 210 is displaying the image 606. Referring to FIG. 7B, when the user of the electronic device 200 uses the finger 602 to input a pattern 704, which is similar to the second predetermined information, the processing unit 250 can determine that the pattern 704 is matched to the second predetermined information. Referring to FIG. 7C, after the operation illustrated in FIG. 7B, the processing unit 250 controls the driving circuitry 230 to stop driving the display 210. Meanwhile, the touch sensor 220 sill maintains the detection functionality. As mentioned previously, the touch sensor 220 may reduce the power consumption of the electronic device 200 by reducing the driving frequency or the scanning frequency of the first stimulus input (which is configured to drive the sensing elements 222 in the touch sensor 220) and/or by partially charging the sensing elements 222 in the touch sensor 220 when the electronic device 200 is in the sleep mode.

The application provides a computer-readable medium, which records a computer program to be loaded into an electronic device to execute the steps of the aforementioned method for controlling the display of the electronic device. The computer program is composed of a plurality of program instructions (for example, an organization chart establishing program instruction, a table approving program instruction, a setting program instruction, and a deployment program instruction, etc), and these program instructions are loaded into the electronic device and executed by the same to accomplish various steps of the method for controlling the display of the electronic device.

In summary, examples of the application provide the method for controlling the display of an electronic device and the electronic device using the same method. The proposed method allows the user of the electronic device to control the display of the electronic device by inputting information (e.g., a gesture, a pattern or an image) on or near the touch sensor of the electronic device, and then the electronic device controls the display based on the inputted information of the user. Therefore, the power button of the electronic device is no longer required, thereby leaving the housing of the electronic device no longer requiring placement holes for the power button. In addition, power consumption of the electronic device can be reduced by partially charging the sensing elements in the touch sensor while maintaining the detection functionality.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. An electronic device, comprising:
   a display, configured to display an image;
   a touch sensor, integrated with the display and configured to detect a contact on the touch sensor and generate a sensing signal when no image is displayed on the display;
   a driving circuitry, coupled to the display and the touch sensor, and configured to partially drive the touch sensor at a first frequency when the display is not driven to display the image and fully drive the touch sensor at a second frequency when the display is driven to display the image, wherein the touch sensor includes a plurality of sensing elements, and a part of the sensing elements of the touch sensor is driven at the first frequency and the other part of the sensing elements of the touch sensor is not driven when no image is displayed on the display;
   a sensing circuitry, coupled to the touch sensor to receive the sensing signal generated by the part of the sensing elements of the partially driven touch sensor when no image is displayed on the display and determining a first information based on the received sensing signal generated by the part of the sensing elements of the partially driven touch sensor; and
   a processing unit, coupled to the driving circuitry and the sensing circuitry and comparing the first information with a first predetermined information;
   wherein when the first information matches the first predetermined information, the driving circuitry drives the display to display the image and drives the part of the sensing elements of the touch sensor and the other part of the sensing elements of the touch sensor at the second frequency, wherein the first frequency is lower than the second frequency.

2. The electronic device of claim 1, wherein the contact is provided by any combination of one or more finger, a face, a palm, a pen or a hover-based input to the touch sensor.

3. The electronic device of claim 1, wherein the touch sensor comprises the sensing elements arranged in rows and columns, and the driving circuitry drives a portion of the sensing elements.

4. The electronic device of claim 1, wherein the sensing signal is generated by the touch sensor when an object touches on the touch sensor or hover above the touch sensor.

5. The electronic device of claim 1, wherein the first information is determined by calculating the sensing signal over a period of time.

6. The electronic device of claim 1, wherein the touch sensor comprises the sensing elements arranged in rows and columns, and the driving circuitry partially charges the sensing elements.

7. The electronic device of claim 1, wherein when the display is driven to display the image, the sensing circuitry receives the sensing signal and determines a second information based on the sensing signal;
   the processing unit compares the second information with a second predetermined information; and
   the driving circuitry disables the display from displaying the image when the second information matches the second predetermined information.

8. The electronic device of claim 7, wherein the first predetermined information is the same as the second predetermined information.

9. The electronic device of claim 1, further comprises a sensor, coupled to the processing unit, sensing a property of an object or an environment external to the electronic device and generating a sensing information based on the sensed property and wherein the processing unit determines whether to drive the touch sensor based on the sensing information when the display is not driven to display the mage.

10. The electronic device of claim 9, wherein the sensing information is an electrical signal as a function of the property of an object sensed by the sensor or the environment external to the electronic device imposed on the sensor.

11. A method for controlling an electronic device having a display and a touch sensor integrated with the display, comprising:
    partially driving the touch sensor at a first frequency when no image is displayed on the display, wherein the touch sensor includes a plurality of sensing elements, and a part of the sensing elements of the touch sensor is driven at the first frequency and the other part of the sensing elements of the touch sensor is not driven when no image is displayed on the display;
    receiving a sensing signal generated by the part of the sensing elements of the partially driven touch sensor when no image is displayed on the display;
    determining first information based on the sensing signal generated by the part of the sensing elements of the partially driven touch sensor;

comparing the first information with first predetermined information when no image is displayed on the display; and driving the display to display an image and fully driving the part of the sensing elements of the touch sensor and the other part of the sensing elements of the touch sensor at a second frequency when the first information matches the first predetermined information, wherein the first frequency is lower than the second frequency.

12. The method of claim 11, wherein the sensing signal is generated by the touch sensor when an object touches on the touch sensor or hover above the touch sensor.

13. The method of claim 11, wherein the first information is determined by calculating the sensing signal over a period of time.

14. The method of claim 11, wherein the first information is determined by calculating the sensing signal when an object touches on the touch sensor or hovers above the touch sensor.

15. The method of claim 11, wherein the step of driving the touch sensor when the display is not driven to display the image comprising driving a portion of the touch sensor to generate the sensing signal.

16. The method of claim 11, wherein the step of driving the touch sensor when the display is not driven to display the image further comprises partially charging the sensing elements on the touch sensor to generate the sensing signal.

17. The method of claim 11, wherein after the step of driving the display to display the image, the method further comprises:

receiving the sensing signal from the touch sensor while the display is displaying the image;

determining second information based on the sensing signal;

comparing the second information with second predetermined information; and disabling the display from displaying the image when the second information matches the second predetermined information.

18. The method of claim 17, wherein the step of disabling the display from displaying the image comprises disabling a backlight module of the display.

19. The method of claim 17, wherein the step of disabling the display from displaying comprises controlling a driving circuitry of the electronic device to stop driving the display to display the image.

20. The method of claim 17, wherein the first predetermined information is the same as the second predetermined information.

21. The method of claim 17, wherein before the step of receiving the sensing signal from the touch sensor further comprises fully charging the sensing elements on the touch sensor to generate the sensing signal.

22. The method of claim 17, wherein before the step of receiving the sensing signal from the touch sensor further comprises changing a driving frequency of the touch sensor.

23. The method of claim 11, further comprises:

sensing a property of an object or an environment external to the electronic device;

generating a sensing information based on the sensed property; and determining whether to drive the touch sensor based on the sensing information.

24. The method of claim 23, wherein the sensing information is an electrical signal as a function of the property of an object sensed by the sensor or the environment external to the electronic device imposed on the sensor.

25. A non-transitory computer-readable medium, recording program instructions for performing the method as claimed in claim 11.

* * * * *